United States Patent [19]

Takagi

[11] Patent Number: 5,079,609

[45] Date of Patent: Jan. 7, 1992

[54] SEMICONDUCTOR DEVICE HAVING DIELECTRIC BREAKDOWN PROTECTION ELEMENT AND METHOD OF FABRICATING SAME

[75] Inventor: Hiroshi Takagi, Hyogo, Japan

[73] Assignee: Mitsubishi Denki Kabushiki Kaisha, Tokyo, Japan

[21] Appl. No.: 451,325

[22] Filed: Dec. 19, 1989

[30] Foreign Application Priority Data

Dec. 28, 1988 [JP] Japan .................................. 63-332236

[51] Int. Cl.⁵ ..................... H01L 29/78; H01L 27/02; H01L 29/06; H01L 21/265
[52] U.S. Cl. .................................. 357/23.14; 357/51; 357/55; 437/20; 437/60; 437/48
[58] Field of Search ............. 357/54, 23.14, 55, 23.13, 357/51; 437/20, 60, 48

[56] References Cited

U.S. PATENT DOCUMENTS

| | | | |
|---|---|---|---|
| 4,072,976 | 2/1978 | Harari | 357/51 |
| 4,190,854 | 2/1980 | Redfern | 357/51 |
| 4,288,829 | 9/1981 | Tango | 357/51 |
| 4,456,939 | 6/1984 | Ozaki et al. | 357/23.13 |
| 4,486,769 | 12/1984 | Simko | 357/41 |
| 4,713,357 | 12/1987 | Imamura . | |
| 4,735,915 | 4/1988 | Kita et al. | 437/60 |
| 4,851,894 | 7/1989 | de Ferron et al. | 357/51 |
| 4,935,801 | 6/1990 | McClure et al. | 357/51 |
| 4,941,028 | 7/1990 | Chen et al. | 357/59 |

FOREIGN PATENT DOCUMENTS

| | | | |
|---|---|---|---|
| 1965799 | 12/1969 | Fed. Rep. of Germany . | |
| 55-091173 | 7/1980 | Japan | 357/23.13 |
| 56-138955 | 10/1981 | Japan | 357/23.13 |
| 56-158479 | 12/1981 | Japan | 357/23.13 |
| 60-72228 | 9/1983 | Japan . | |
| 1171874 | 4/1968 | United Kingdom | 357/23.14 |

OTHER PUBLICATIONS

W. L. Wright, "Electrostatic Discharge Protection of FET Gates with Thin Film Capacitors", IBM Technical Disclosure Bulletin, vol. 21, No. 6, Nov. 1978, pp. 2396-2397.

Primary Examiner—Andrew J. James
Assistant Examiner—Daniel Kim
Attorney, Agent, or Firm—Lowe, Price, LeBlanc & Becker

[57] ABSTRACT

A semiconductor device exposed to irradiation (21, 22) of charged particles in a fabrication process thereof includes: at least a first conductive region (3, 1) and a second conductive region (4a, 4b) formed at different positions, electrically insulated from each other; a third coductive region (8 , 9) provided at least over the first conductive region (3, 1) and the second conductive region (4a, 4b); a first insulator layer region (5, 7) sandwiched between the first conductive region (3, 1) and the third conductive region (8, 9) to insulate the first and third conductive regions from each other; and a second insulator layer region (6a, 6b) sandwiched between the second conductive region (4a, 4b) and the third conductive region (8, 9) to insulate the second and third conductive regions from each other, and the second conductive region (4a, 4b) has a portion shaped to cause dielectric breakdown to be more liable to occur in the second insulator layer region (6a, 6b) than in the first insulator layer region (5, 7).

18 Claims, 9 Drawing Sheets

FIG. 1A(1)
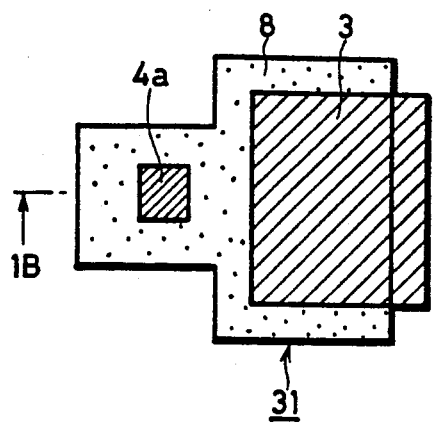
FIG. 1A(2)
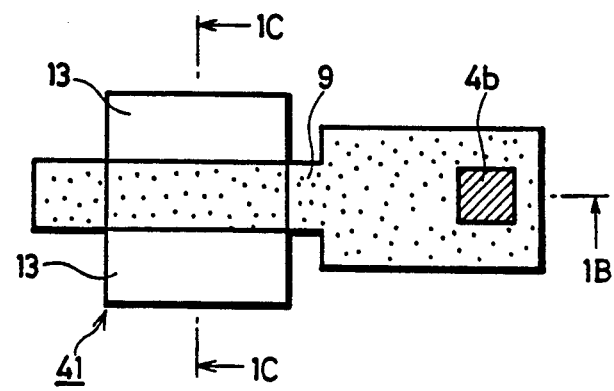
FIG. 1B
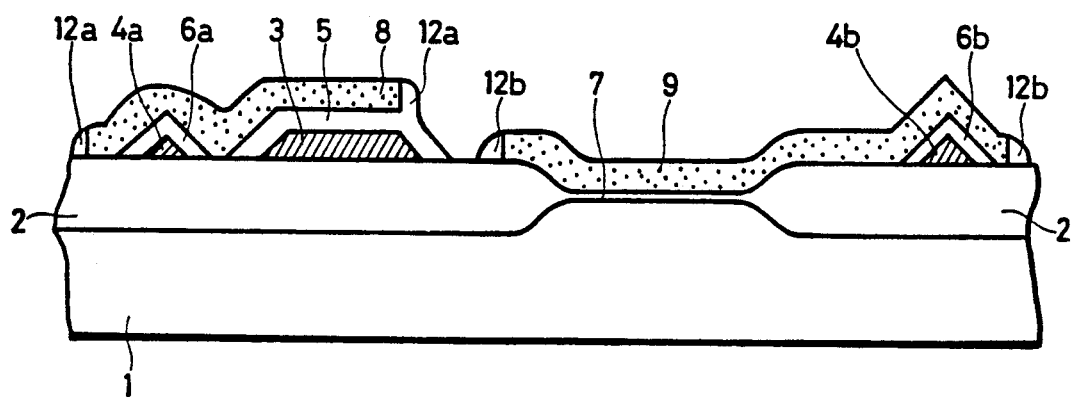
FIG. 1C
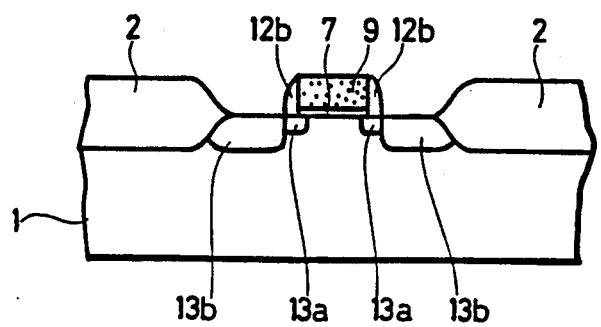

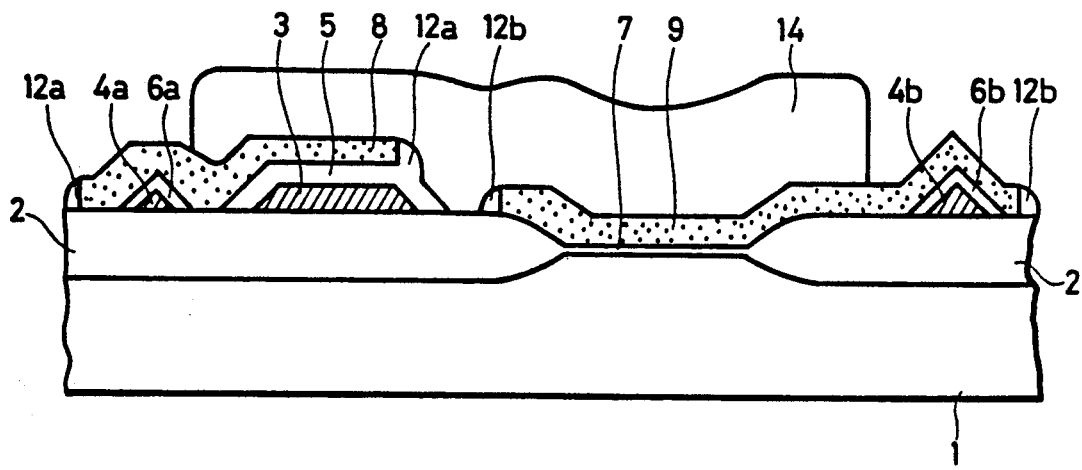
FIG.3A
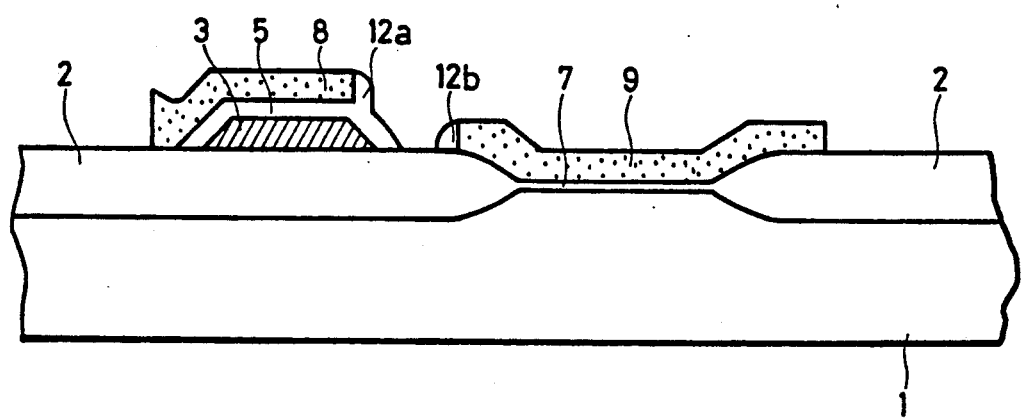
FIG.3B
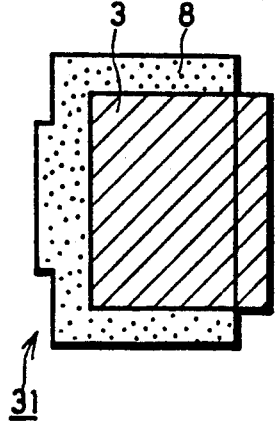
FIG. 3C(1)
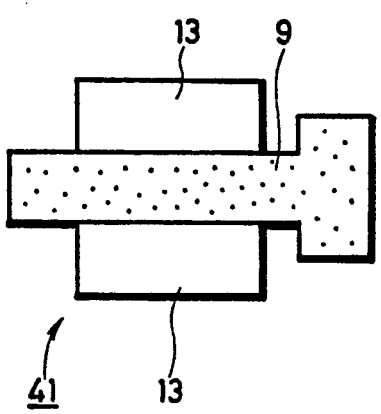
FIG. 3C(2)

SEMICONDUCTOR DEVICE HAVING DIELECTRIC BREAKDOWN PROTECTION ELEMENT AND METHOD OF FABRICATING SAME

BACKGROUND OF THE INVENTION

1. Field of the Invention

The present invention generally relates to semiconductor devices and fabricating methods therefore and particularly to dielectric breakdown protection elements in such devices for preventing dielectric breakdown to occur in a functional portion of such devices and a method of manufacturing therefore.

2. Description of the Related Art

FIG. 5A is a plan view showing an example of a conventional semiconductor device exposed to irradiation of charged particles in a fabricating process. FIGS. 5B and 5C are sectional views taken along the line 5B—5B and the line 5C—5C in FIG. 5A, respectively. Referring to those figures, an oxide film 2 for isolation is formed on a silicon substrate 1. A capacitor 30 is provided on the oxide film 2. The capacitor 30 includes a first capacitor electrode layer 3 of polysilicon formed on the isolation oxide film 2. The first capacitor electrode layer 3 is covered with a capacitor dielectric layer 5 formed of an oxide film. A second capacitor electrode layer 8 of polysilicon is formed on the capacitor dielectric layer 5.

A MOS transistor 40 is also provided on the silicon substrate 1. The transistor 40 includes a gate dielectric layer 7 of an oxide formed on the substrate 1. A gate electrode 9 of polysilicon is formed on the gate dielectric layer 7. A pair of source/drain regions 10 are formed on both sides of a channel region under the gate dielectric layer 7.

FIGS. 6A to 6E are sectional views for explaining an example of a process of fabricating the semiconductor device shown in FIGS. 5A to 5C.

Referring to FIG. 6A, a thick oxide film 2 for isolation is selectively formed on a silicon substrate 1. A first capacitor electrode 3 of polysilicon is selectively formed on the isolation oxide film 2.

Referring to FIG. 6B, the first capacitor electrode 3 is covered with a capacitor dielectric layer 5 by thermal oxidation and a gate dielectric layer 7 is selectively formed by thermal oxidation on an exposed surface region of the silicon substrate 1.

Referring to FIG. 6C, a second capacitor electrode 8 of polysilicon is selectively formed on the capacitor dielectric layer 5 and a gate electrode 9 of polysilicon is selectively formed on the gate dielectric layer 7.

Referring to FIG. 6D as well as FIG. 6E as a sectional view taken along the line 6E—6E in FIG. 6D, a pair of source/drain regions 10 are formed in a surface layer of the substrate 1 by ion implantation 20 in a self-aligning manner utilizing the oxide film 2 and the gate electrode 9 as a mask pattern. Ion implantation is described in detail, for example, in a book titled "Ion Implantation" published by Wiley-Interscience Publication. On this occasion, the second capacitor electrode 8 and the gate electrode 9 are charged positively by the implanted ions. It is possible that a surface potential of a layer charged with ions becomes as high as 50V. If the charged quantity exceeds a certain value, dielectric breakdown may occur in the capacitor dielectric layer and/or the gate dielectric layer 7 as shown by arrows B. Once such dielectric breakdown occurs in the semiconductor device, the semiconductor device becomes a defective product.

As described above, the conventional semiconductor device exposed to irradiation of charged particles in its fabrication process involves disadvantages such as lowering of the yield in production or lowering of reliability of the device due to dielectric breakdown which would occur in the capacitor dielectric layer, the gate dielectric layer of the transistor or the like during irradiation of charged particles.

It may be possible to avoid the dielectric breakdown by lowering the ion implantation rate so as to allow relaxation of the charge concentration caused by the ion implantation. With the low ion implantation rate, however, it takes long time to obtain a desired impurity concentration in a pair of source/drain regions and thus production rate of semiconductor devices is lowered.

It may also be possible to avoid the dielectric breakdown by neutralizing the positive charges in the ion implanted layer with an electron shower. However, the electron shower must be generated in the ion implanting chamber and then it is difficult to obtain a stable electron shower during the ion implantation.

SUMMARY OF THE INVENTION

In view of the above described disadvantages of the prior art, an object of the present invention is to improve yield and reliability of a semiconductor device exposed to irradiation of charged particles in a fabrication process thereof.

Another object of the present invention is to prevent dielectric breakdown in a functional element of a semiconductor device as a result of charging by ion implantation during manufacturing thereof.

A further object of the present invention is to provide a method of manufacturing a semiconductor device, wherein dielectric breakdown of a functional component thereof during ion implantation does not occur.

According to an aspect of the present invention, a semiconductor device exposed to irradiation of charged particles in a fabrication process includes: at least a first conductive region and a second conductive region formed at different positions and electrically isolated from each other; a third conductive region provided at least over the first and second conductive regions; a first insulator layer region sandwiched between the first and third conductive regions to isolate the first and third conductive regions from each other; and a second insulator layer region sandwiched between the second and third conductive regions to isolate the second and third conductive regions from each other, and the second conductive region has a portion shaped such that dielectric breakdown may be more liable to occur in the second insulator layer region than in the first insulator layer region when the third conductive region is charged under exposure to charged particles.

According to another aspect of the present invention, a method of fabricating a semiconductor device exposed to irradiation of charged particles in a fabricating process thereof includes the steps of: forming at least a first conductive region and a second conductive region at different positions, electrically insulated from each other; forming a first insulator layer over the first conductive region and a second insulator layer region over the second conductive region; and forming a third conductive region at least over the first and second insulator layer regions, the second conductive region being formed to have a portion shaped such that dielectric breakdown may be more liable to occur in the second insulator layer region than in the first insulator layer region when the third conductive region is charged under exposure to charged particles.

In the semiconductor device according to the present invention, exposed to irradiation of charged particles in its fabrication process, the second conductive region has a portion shaped such that dielectric breakdown may be more liable to occur in the second insulator layer region than in the first insulator layer region. Accordingly, even if the charged quantity of the third conductive region increases as a result of irradiation of charged particles, dielectric breakdown occurs in the second insulator layer region earlier than in the first insulator layer region and electric charge is absorbed in the second conductive region. Thus, the third conductive region can be protected from being excessively charged and dielectric breakdown in the first insulator layer region can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A(1) and 1A(2) are plan views showing a semiconductor device according to an embodiment of the present invention.

FIGS. 1B and 1C are sectional views taken along the line 1B—1B and the line 1C—1C, respectively, in FIG. 1A.

FIGS. 3A and 3B are sectional views for explaining steps of removing portions liable to cause dielectric breakdown in the semiconductor device shown in FIGS. 1A to 1C.

FIGS. 3C(1) and 3C(2) are plan views of the semiconductor device shown in FIG. 3B.

DESCRIPTION OF THE PREFERRED EMBODIMENTS

Figure 2A:
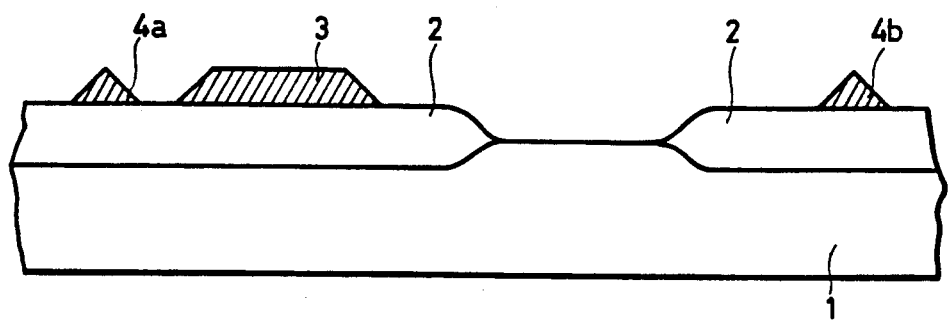
FIGS. 2A to 2H are sectional views for explaining an example of a fabrication process of the device shown in FIGS. 1A to 1C.

Referring to FIGS. 1A(1), 1A(2), 1B and 1C, an oxide film 2 for isolation is formed on a silicon substrate 1. A capacitor 31 is provided on the isolation oxide film 2. The capacitor 31 includes a first capacitor electrode 3 of polysilicon formed on the isolation oxide film 2. A first separated conductive layer 4a of polysilicon is formed adjacent to the first capacitor electrode 3.

The first conductive layer 4a is shaped to establish a high electric field so as to undergo dielectric breakdown prior to breakdown of the capacitor electrode 3.

Preferably, the shape of the first conductive layer 4a is approximately a triangle in section as shown in FIG. 1B and more preferably an isosceles triangle with an apex having an acute angle. Since force lines in an electrostatic field tend to be concentrated at a sharper corner, the first conductive layer 4a tends to cause dielectric breakdown easier at its apex.

The shape of the capacitor electrode 3 is a tropezoid, with angles of side walls with respect to the substrate being substantially equal to the condition of the first conductive layer 4a. This occurs as a result of processing the two conductive layers 3 and 4a from a polysilicon layer as described hereinafter, and additionally increases breakdown voltage of the capacitor because of obtuse angles formed between the top surface and side walls of the capacitor electrode 3.

The first capacitor electrode 3 is covered with a capacitor dielectric layer 5 of an oxide and the first conductive layer 4a is covered with a first insulator layer 6a of an oxide. The capacitor dielectric layer 5 and the first insulator layer 6a are covered with a second capacitor electrode 8 of polysilicon. First insulator walls 12a are formed on sidewalls of the second capacitor electrode 8.

Further, a MOS transistor 41 is formed on the silicon substrate 1. The transistor 41 includes a gate dielectric layer 7 of an oxide formed on the substrate 1. A pair of source/drain regions 10 are formed on both sides of a channel region under the gate dielectric layer 7. Each of the regions 10 includes a low impurity concentration region 13a and a high impurity concentration region 13b. A second separated conductive layer 4b of polysilicon is formed on the oxide film 2 near the gate dielectric layer 7. The second conductive layer 4b has an acute-angled summit portion in the same manner as the first conductive layer 4a and it is covered with a second insulator layer 6b. The gate dielectric layer 7 and the second insulator layer 6b are covered with a gate electrode 9 of polysilicon. Second insulator walls 12b are formed on sidewalls of the gate electrode 9.

FIGS. 2A to 2H are sectional views for explaining an example of a fabrication process of the semiconductor device shown in FIGS. 1A to 1C.

Referring to FIG. 2A, a thick oxide film 2 for isolation is selectively formed on the silicon substrate 1. The first capacitor electrode 3 and first and second conductive layers 4a and 4b of polysilicon are selectively formed on the oxide film 2 for isolation. The first and second conductive layers 4a and 4b have acute-angled summits.

Figure 2B:
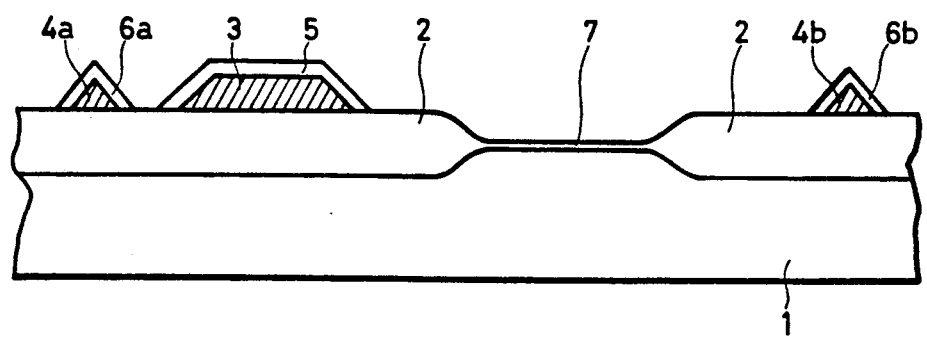

Referring to FIG. 2B, free surfaces of the first capacitor electrode 3 and first and second conductive layers 4a and 4b are thermally oxidized and the capacitor dielectric layer 5 and the first and second insulator layers 6a and 6b are formed. The gate dielectric layer 7 is selectively formed by thermal oxidation in an expose surface region of the silicon substrate 1.

Figure 2C:
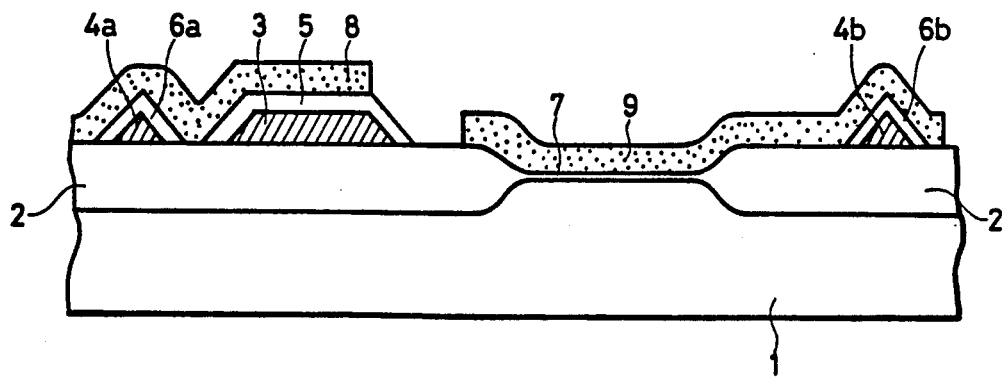

Referring to FIG. 2C, the second capacitor electrode 8 of polysilicon is selectively formed to cover the capacitor dielectric layer 5 and the first insulator layer 6a. The gate electrode 9 of polysilicon is selectively formed over the gate dielectric layer 7 and the second insulator layer 6b.

Figure 2D:
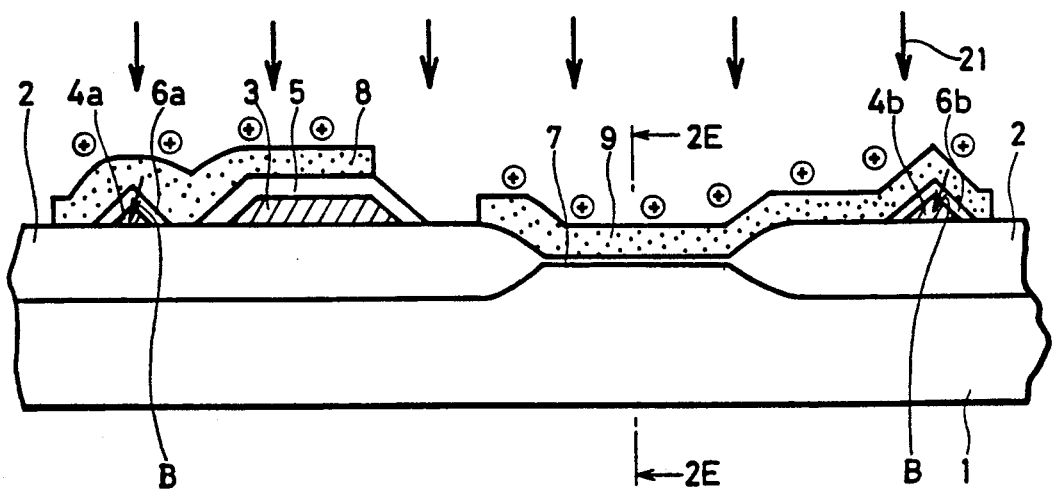
Figure 2E:
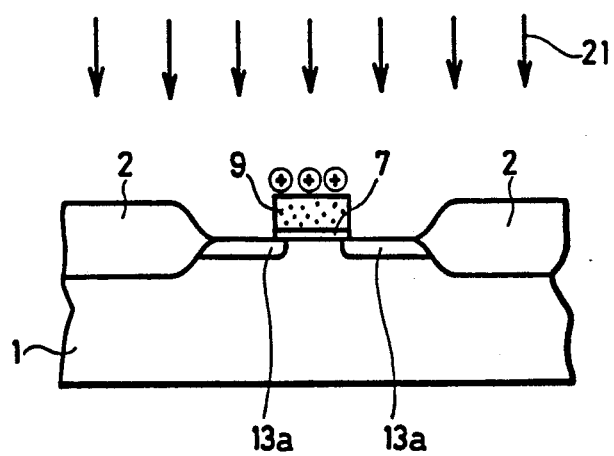

Referring to FIG. 2D as well as FIG. 2E as a sectional view taken along the line 2E—2E in FIG. 2D, the low impurity concentration regions 13a of the pair of source/drain regions are formed in surface regions of the substrate 1 by ion implantation 21. In the event that the charged quantity of the second capacitor electrode 8 increases during the ion implantation 21, dielectric breakdown tends to occur in the first dielectric layer 6a before dielectric breakdown in the capacitor dielectric layer 5, as shown by an arrow B in FIG. 2D. This is because the first conductive layer 4a has the acute-angled summit portion and electric fields due to the charging of the second capacitor electrode 8 concentrate on such summit portion. If dielectric breakdown occurs in the first dielectric layer 6a, electric charge in the second capacitor electrode 8 is absorbed in the first conductive layer 4a and charging of the second capacitor electrode 8 is suppressed, whereby dielectric breakdown in the capacitor dielectric layer 5 can be prevented.

Similarly, in the event that the charged quantity of the gate electrode 9 increases, dielectric breakdown tends to occur in the second insulator layer 6b before dielectric breakdown in the gate dielectric layer 7 as shown another arrow B in FIG. 2D, making it possible to prevent dielectric breakdown in the gate dielectric layer 7.

Figure 2F:
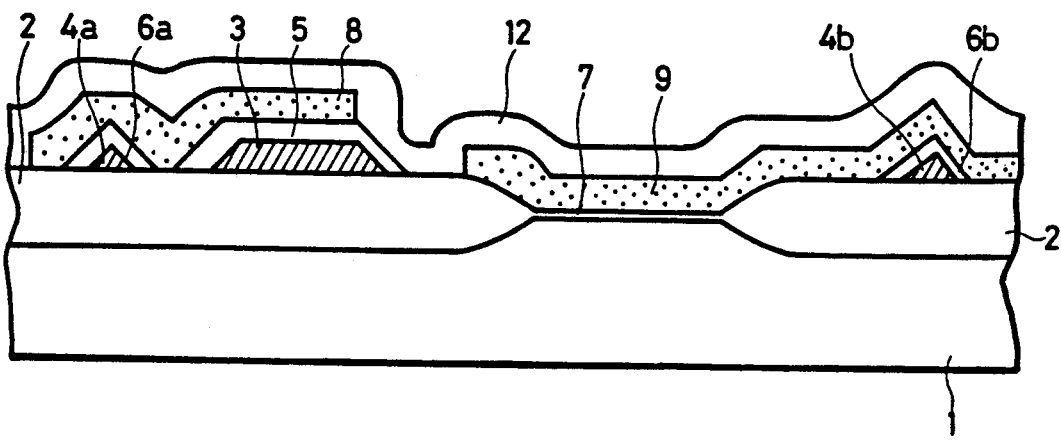

Referring to FIG. 2F, an oxide layer 12 is deposited over the entire free surfaces of the isolation oxide film 2, second capacitor electrode 8, gate electrode 9 and the like.

Figure 2G:
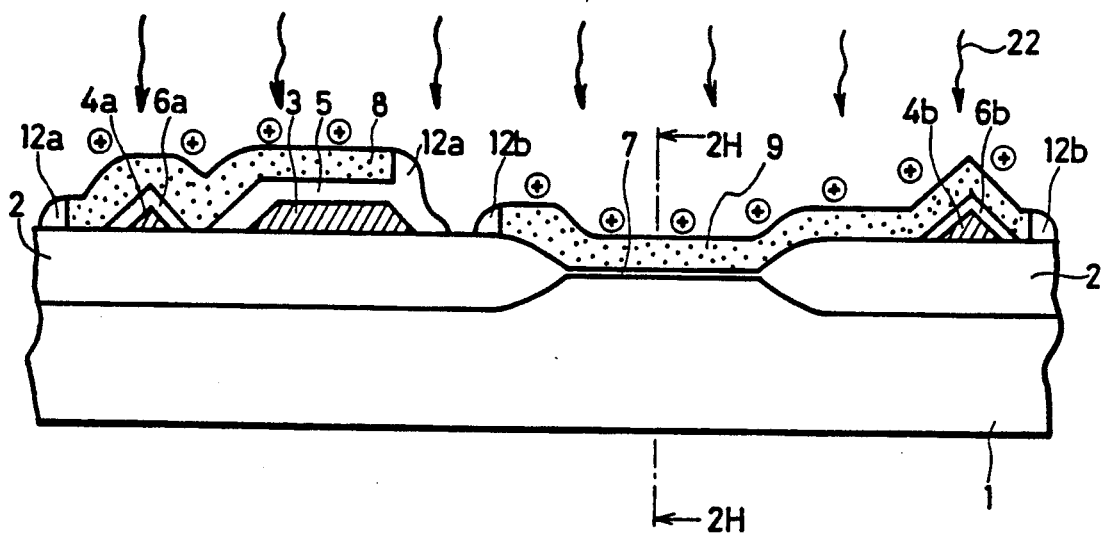
Figure 2H:
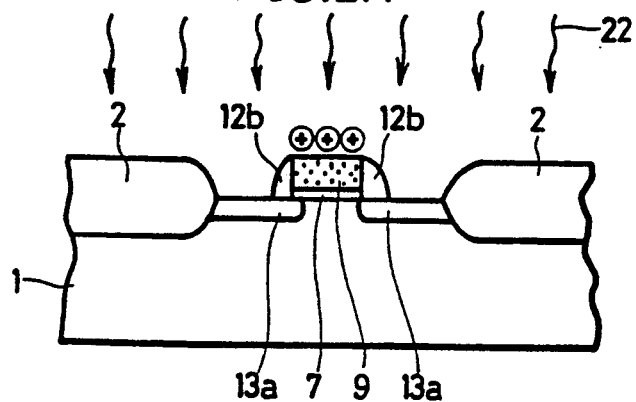

Referring to FIG. 2G as well as FIG. 2H as a sectional view taken along the line 2H—2H in FIG. 2G, the oxide layer 12 is anisotropically etched by plasma 22. As a result, the first insulator walls 12a remain on the sidewalls of the second capacitor electrode 8 and the second insulator walls 12b remain on the sidewalls of the gate electrode 9. During the plasma etching, even if the charged quantity of the second capacitor electrode 8 increases, dielectric breakdown will occur in the first insulator layer 6a invariably before dielectric breakdown in the capacitor dielectric layer 5 and accordingly it becomes possible to prevent dielectric breakdown in the capacitor dielectric layer 5. Similarly, even if the charged quantity of the gate electrode 9 increases, dielectric breakdown will occur in the second insulator layer 6b invariably before dielectric breakdown in the gate dielectric layer 7 and thus it becomes possible to prevent dielectric breakdown in the gate dielectric layer 7.

After that, ion implantation is further effected by using the second insulator walls 12b as masks, whereby the high impurity concentration regions 13b of the source/drain regions 13 are formed in a self-aligning manner. Thus, the semiconductor device shown in FIGS. 1A to 1C is completed.

In the completed semiconductor device shown in FIGS. 1A to 1C, the first and second conductive layers 4a and 4b and the first and second insulator layers 6a and 6b are left. However, since those layers do not function as circuit elements, they may be removed by optional steps as shown in FIGS. 3A to 3C(1) and 3C(2).

Referring to the sectional view of FIG. 3A, the capacitor portion 31 and the transistor portion 41 are covered with a resist layer 14. Etching is effected by using the resist layer 14 as a mask.

Referring to FIG. 3B, the semiconductor device is shown in the sectional view, in which the first and second conductive layers 4a and 4b and the first and second insulator layers 6a and 6b are removed by the etching and the resist layer 14 is also removed.

Referring to FIGS. 3C(1) and 3C(2), the semiconductor device of FIG. 3B is shown as a plan view.

Figure 4A:
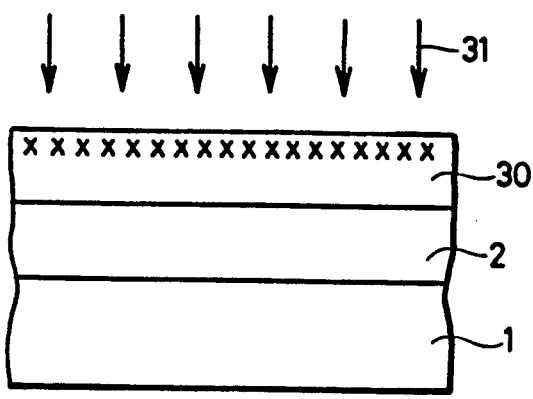
FIGS. 4A to 4C are sectional views for explaining steps of forming a conductive region of a triangle in section.
Figure 4B:
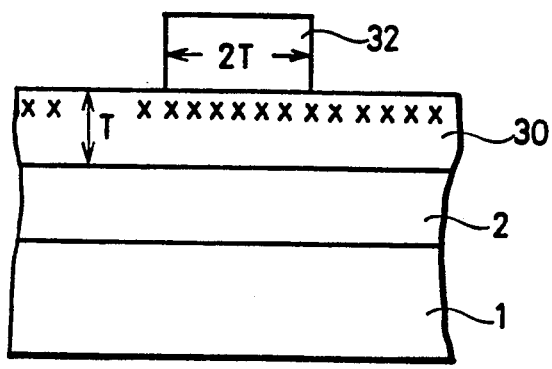
Figure 4C:
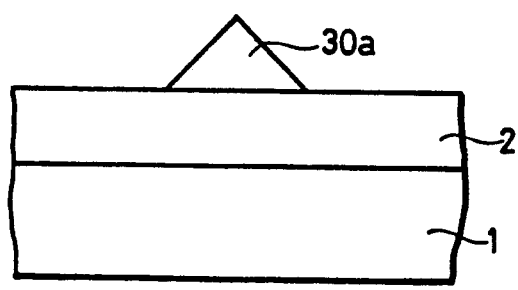
Figure 5A:
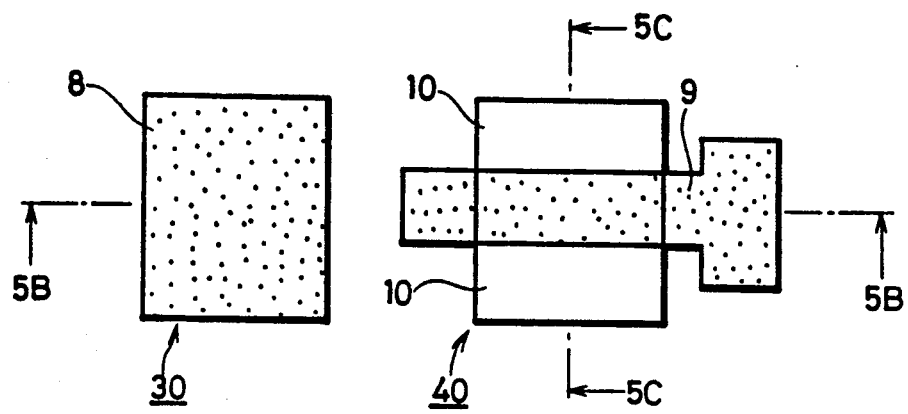
FIG. 5A is a plan view showing an example of a conventional semiconductor device exposed to irradiation of charged particles in a fabrication process thereof.
Figure 5B:
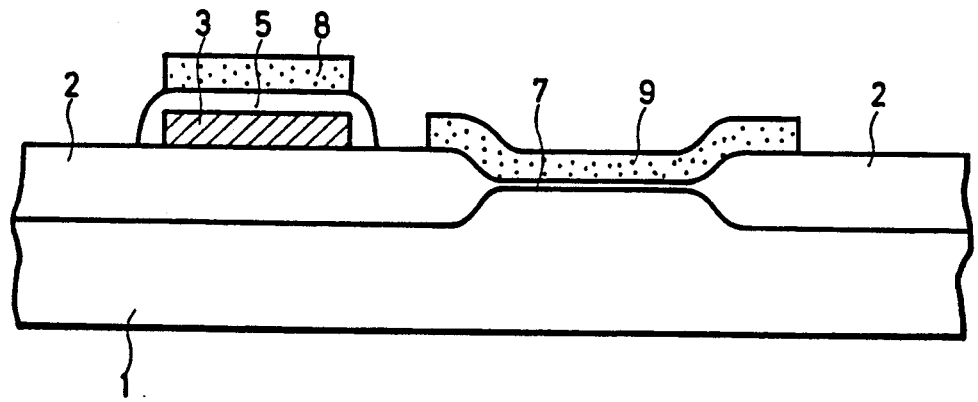
FIGS. 5B and 5C are sectional views taken along the line 5B—5B and the line 5C—5C, respectively, in FIG. 5A.
Figure 5C:
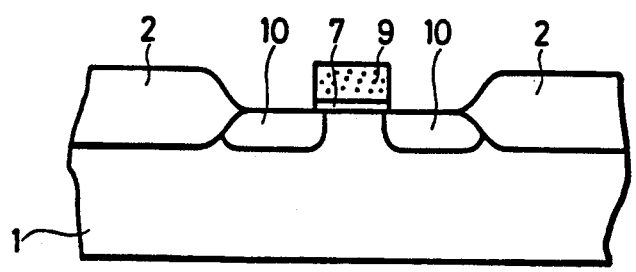
Figure 6A:
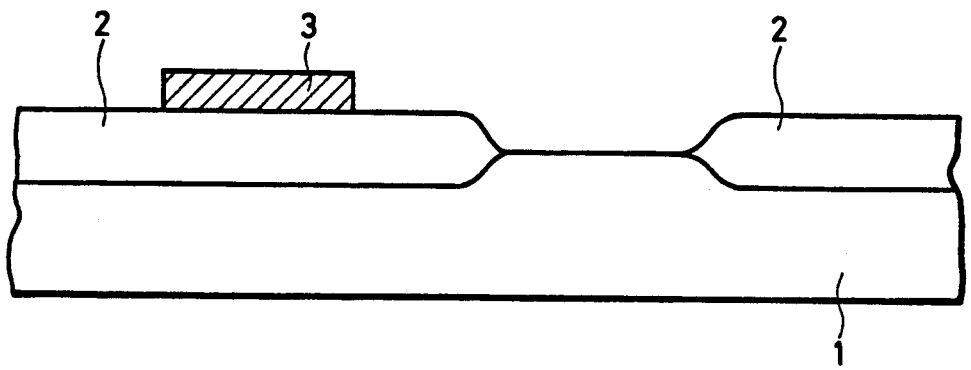
FIGS. 6A to 6E are sectional views for explaining an example of a fabrication process of the semiconductor device shown in FIGS. 5A to 5C.
Figure 6B:
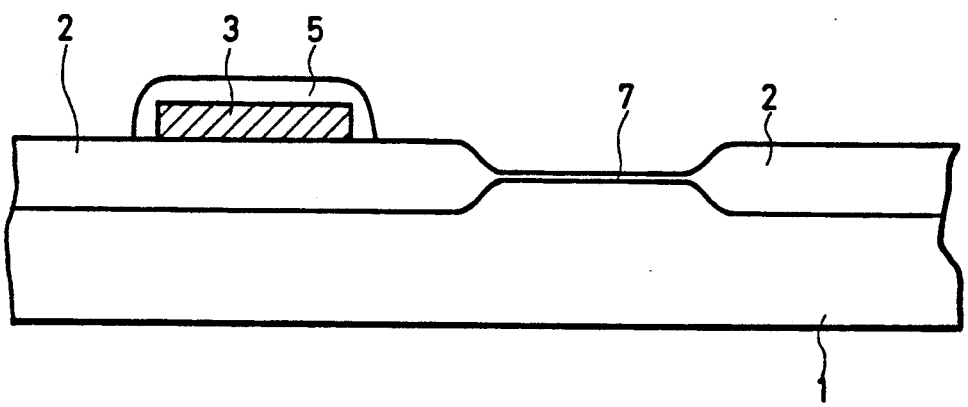
Figure 6C:
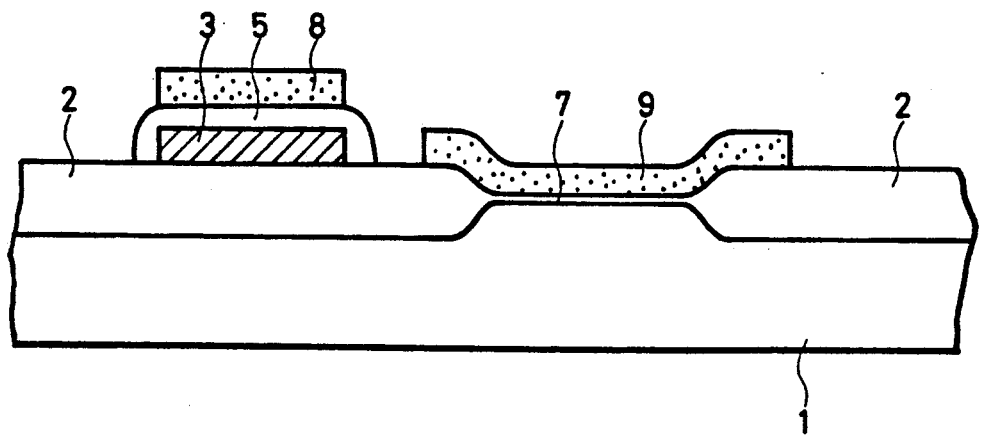
Figure 6D:
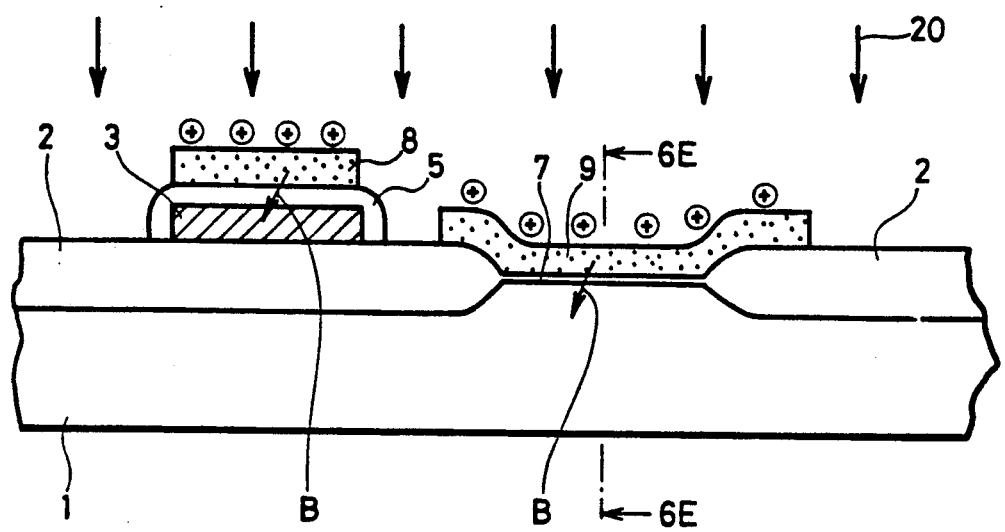
Figure 6E:
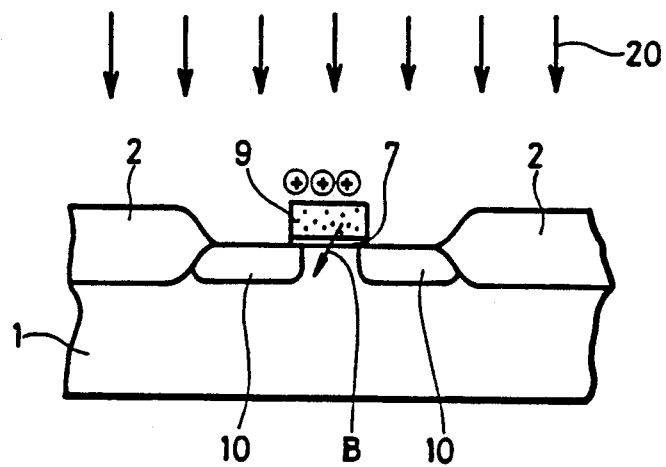

A polysilicon layer of a triangle in section can be formed with a process as shown in FIGS. 4A to 4C, for example.

Referring to FIG. 4A, the top surface layer of a polysilicon layer 30 is bombarded with ions 31 in order to destroy or weaken atomic bonds in the surface layer.

Referring to FIG. 4B, a resist layer 32 is formed on the polysilicon layer 30. The resist layer 32 has a width 2T, the value of which is two times of the thickness value T of the polysilicon layer 30.

Referring to FIG. 4C, the polysilicon layer 30 is etched and then a polysilicon layer 30a of a triangle in section is formed, because the polysilicon layer 30 is not only etched in the direction of the thickness but also etched laterally beneath the resist layer 32 due to the weak atomic bonds in the surface layer of the polysilicon layer 30.

In the above described embodiment, the capacitor dielectric layer 5 and the gate dielectric layer 7 are formed of an oxide. However, it will be understood by those skilled in the art that those layers may be formed of a nitride.

In addition, although polysilicon is used as the conductive material in the above described embodiment, it will be clear that other conductive materials may be used.

As described in the foregoing, according to the present invention, it is possible to provide a semiconductor device which is exposed to irradiation of charged particles in its fabrication process and which has improved yield and reliability. Thus, the semiconductor device according to the present invention is provided with portions electrically isolated and liable to cause dielectric breakdown near the circuit elements and occurrence of dielectric breakdown can be prevented in the circuit elements during irradiation of charged particles.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device exposed to irradiation of charged particles in a fabrication process thereof, comprising:

at least a first conductive region and a second conductive region formed at different positions and electrically insulated from each other, a third conductive region provided at least on said first conductive region and said second conductive region, a first insulator region sandwiched between said first conductive region and said third conductive region to insulate said first and third conductive regions from each other, and a second insulator layer region sandwiched between said second conductive region and said third conductive region to insulate said second and third conductive region from each other, said second conductive region having a portion shaped to cause dielectric breakdown to be more liable to occur in said second insulator layer region than in said first insulator layer region when said third conductive region is charged by being exposed to said irradiation of charged particles.

2. A semiconductor device in accordance with claim 1, wherein said second conductive region is approximately a triangle in section.

3. A semiconductor device in accordance with claim 2, wherein said second conductive region is approximately an isosceles triangle in section.

4. A semiconductor device in accordance with claim 2, wherein said second conductive region has an apex of an acute angle.

5. A semiconductor device in accordance with claim 1, wherein said first conductive region is a semiconductor substrate, said third conductive region is a gate electrode of a field effect transistor formed on said semiconductor substrate, said first insulator layer region is a gate dielectric layer of said field effect transistor, and said irradiation of charged particles includes ion irradiation for forming source/drain regions of said field effect transistor.

6. A semiconductor device in accordance with claim 5, wherein said second conductive region is provided on an oxide film for isolation formed on said semiconductor substrate.

7. A semiconductor device in accordance with claim 5, wherein said irradiation of charged particles includes plasma etching for anisotropically etching an oxide layer.

8. A semiconductor device in accordance with claim 1, wherein said first conductive region is a first capacitor electrode of a capacitor provided on an oxide film for isolation formed on a semiconductor substrate, said first insulator layer region is a capacitor dielectric layer of said capacitor, and said third conductive region is a second capacitor electrode of said capacitor.

9. A semiconductor device in accordance with claim 8, wherein said second conductive region is also formed on said oxide film for isolation.

10. A semiconductor device in accordance with claim 8, wherein said irradiation of charged particles includes ion irradiation for forming source/drain regions of a field effect transistor formed on said semiconductor substrate.

11. A semiconductor device in accordance with claim 8, wherein said irradiation of charged particles includes plasma etching for anisotropically etching an oxide layer.

12. A semiconductor device in accordance with claim 1, wherein said second conductive region is formed of polysilicon.

13. A semiconductor device in accordance with claim 1, wherein said semiconductor device is found on a substrate and second conductive region is formed on a major surface of said substrate.

14. A semiconductor device formed on a substrate, comprising:
first and second conductive regions formed spaced apart on a major surface of said substrate and electrically insulated from each other,
a third conductive region provided on said first conductive region and said second conductive region,
a first insulator region sandwiched between said first conductive region and said third conductive region to insulate said first and third conductive regions from each other, and
a second insulator layer region sandwiched between said second conductive region and said third conductive region to insulate said second and third conductive regions from each other,
said second conductive region having a portion shaped to cause dielectric breakdown to be more liable to occur in said second insulator layer region than in said first insulator layer region.

15. A semiconductor device in accordance with claim 14, wherein said second conductive region is formed of polysilicon.

16. A semiconductor device in accordance with claim 1, wherein the entire second conductive region is approximately a triangle in section.

17. A semiconductor device in accordance with claim 2, wherein the entire second conductive region is approximately an isosceles triangle in section.

18. A semiconductor device in accordance with claim 2, wherein the entire second conductive region has an apex of an acute angle.

* * * * *